United States Patent
Graf et al.

(10) Patent No.: US 10,083,891 B1
(45) Date of Patent: Sep. 25, 2018

(54) MEMORY HAVING THERMOELECTRIC HEAT PUMP AND RELATED IC CHIP PACKAGE AND METHOD

(71) Applicant: GLOBALFOUNDRIES INC., Grand Cayman (KY)

(72) Inventors: Richard S. Graf, Gray, ME (US); Sebastian T. Ventrone, South Burlington, VT (US); Ezra D. B. Hall, Richmond, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/789,108

(22) Filed: Oct. 20, 2017

(51) Int. Cl.
| | | |
|---|---|---|
| *H01L 23/38* | (2006.01) | |
| *H01L 27/108* | (2006.01) | |
| *H01L 23/34* | (2006.01) | |
| *H01L 25/16* | (2006.01) | |
| *H01L 23/498* | (2006.01) | |
| *H01L 23/48* | (2006.01) | |

(Continued)

(52) U.S. Cl.
CPC ............ *H01L 23/38* (2013.01); *H01L 23/345* (2013.01); *H01L 23/3675* (2013.01); *H01L 23/481* (2013.01); *H01L 23/49816* (2013.01); *H01L 23/49833* (2013.01); *H01L 25/16* (2013.01); *H01L 27/10897* (2013.01); *H01L 35/10* (2013.01)

(58) Field of Classification Search
CPC .......................... G11C 11/401–11/4099; G11C 14/0009–14/0045; G11C 2211/4016; H01L 23/38; H01L 27/1023; H01L 27/108–27/10897; H01L 28/40–28/92; H01L 33/645; H01L 2924/1436–2924/14369
See application file for complete search history.

(56) References Cited

U.S. PATENT DOCUMENTS

2017/0038805 A1* 2/2017 Chun ...................... G06F 1/206

OTHER PUBLICATIONS

"High Bandwidth Memory—White Paper" AnySilicon, n.p., n.d., 7 pages <http://anysilicon.com/high-bandwidth-memory-white-paper/>.

(Continued)

*Primary Examiner* — Daniel Shook
(74) *Attorney, Agent, or Firm* — Yuanmin Cai; Hoffman Warnick LLC

(57) ABSTRACT

An IC chip package includes: a base substrate; an interposer substrate including a plurality of wires therein, the interposer substrate operatively coupled to the base substrate; and a processor operatively positioned on the interposer substrate. A memory is operatively positioned on the interposer substrate and operatively coupled to the processor through the interposer substrate. The memory includes: a 3D DRAM stack, a thermoelectric heat pump coupled directly to an uppermost layer of the 3D DRAM stack, and a memory controller operatively coupled to the 3D DRAM stack to control operation of the 3D DRAM stack. A temperature controller operatively coupled to the thermoelectric heat pump controls a temperature of the 3D DRAM stack using the thermoelectric heat pump. A lid may thermally couple to an uppermost surface of the processor and an uppermost surface of the thermoelectric heat pump.

14 Claims, 3 Drawing Sheets

(51) Int. Cl.
*H01L 23/367* (2006.01)
*H01L 35/10* (2006.01)

(56) References Cited

OTHER PUBLICATIONS

"Peltier Cooloer min-TEC Cooling in new dimensions" Micropelt, n.p., n.d., 9 pages <http://www.micropelt.com/en/products/peltier-coolers.html>.

* cited by examiner

MEMORY HAVING THERMOELECTRIC HEAT PUMP AND RELATED IC CHIP PACKAGE AND METHOD

BACKGROUND

The present disclosure relates to memory for an integrated circuit (IC) chip packaging, and more particularly to memory including a thermoelectric heat pump, an IC chip package including the memory and a related method.

IC chip packages may include a processor, such as an application specific IC (ASIC) chip, connected with a number of electrical interconnecting layers to scale the chip package for interconnection to other electrical devices. For example, many IC chip packages include a processor coupled by a number of micro-bumps to an interposer substrate, i.e., in 2.5D chip packaging technology. The interposer substrate may include a frontside metal interconnect layer, an interposer substrate including electrical interconnections, e.g., through silicon vias (TSVs), and a backside metal interconnect layer (e.g., a redistribution layer (RDL)). Each layer in the interposer substrate electrically connects to an adjacent layer to route electrical lines through the interposer substrate. The backside metal interconnect layer of the interposer substrate may connect to flip chip bumps, e.g., a controlled collapse chip connect (C4) layer, that connects to a laminated base substrate, e.g., printed wiring board (PCB), perhaps through a system-in-package (SiP) substrate. The base substrate can be connected to any variety of other electrical devices.

Certain types of IC chip packages include a processor integrated on an interposer substrate with another device such as a memory. One form of memory is a high bandwidth memory (HBM), which includes a three dimensional (3D) stacked, dynamic random access memory (DRAM). A memory is typically coupled to the interposer substrate and base substrate similarly to the processor. The memory is also operationally coupled to the processor. One challenge for an IC chip package including a processor and a memory is addressing mismatched operational temperatures of each device. For example, for a combined processor and memory chip package there is a significant mismatch in maximum junction temperature between the DRAM in the memory and the processor. For example, the memory may have a maximum junction temperature (Tj max) ranging from approximately 85° C. up to 105° C., but the processor may have a Tj max ranging up to 125° C. Furthermore, the processor may have an operational temperature range from −40° C. to 125° C., while the memory may have an operational temperature range from 0° C. and 85° C.

The operational temperature differentials can pose a number of challenges. For example, while the processor can operate at 125° C., the DRAM cell retention time decreases exponentially above approximately 85° C., greatly diminishing the performance of the memory. Similarly, the processor can operate below 0° C., but the memory needs to be heated above that temperature to operate. Other devices packaged with a processor can pose similar challenges due to operational temperature differences.

In most cases, heat dissipation is the only thermal issue addressed in IC chip packages. Heat dissipation is oftentimes addressed using a cover structure, which typically can take two forms: a lid or bare die. In either case, a heat sink is typically coupled to remove heat from the IC chip package. Where a lid is provided, it extends over the processor, and couples typically to the base substrate. Lids are advantageous because they allow one to handle the IC chip package with less concern about damage, and they reduce heat sink complexity. A heat sink is typically coupled to the lid using a thermal interface material (TIM) that acts to efficiently transfer heat to the heat sink to cool the IC chip package. While a lid thermally links the processor and the memory in the package, promoting heat transfer between the processor and the memory, they do not address all of the limitations posed by operational temperature differences. In other cases, a stiffener extends from the base substrate about the processor, leaving the processor and the memory thermally separated in the package. A heat sink may be coupled to an upper surface of the processor and/or the memory. The stiffener approach presents challenges because any heat sink used is more complex, and handling the IC chip package without damaging it is more cumbersome. The stiffener, like the lid, also does not address all of the limitations posed by operational temperature extremes of the processor and the memory in the IC chip package.

One approach to address operational temperature differences employs a thermoelectric cooling device configured to thermally control the memory in response to a predicted change in temperature of the memory. In this case, a heat spreader is mounted to the memory, the thermoelectric cooler is positioned on the heat spreader, and a heat sink is mounted on the thermoelectric cooler. The thermoelectric cooler is controlled via electrical connections directly thereto from a separate power manager. This approach is cumbersome to build.

SUMMARY

A first aspect of the disclosure is directed to an integrated circuit (IC) chip package, comprising: a base substrate; an interposer substrate including a plurality of wires therein, the interposer substrate operatively coupled to the base substrate; a processor operatively positioned on the interposer substrate; a memory operatively positioned on the interposer substrate and operatively coupled to the processor through the interposer substrate, the memory including: a three dimensional, dynamic random access memory (3D DRAM) stack, and a thermoelectric heat pump coupled directly to an uppermost layer of the 3D DRAM stack; a memory controller operatively coupled to the 3D DRAM stack to control operation of the 3D DRAM stack; a temperature controller operatively coupled to the thermoelectric heat pump for controlling a temperature of the 3D DRAM stack using the thermoelectric heat pump; and a lid thermally coupled to an uppermost surface of the processor and an uppermost surface of the thermoelectric heat pump.

A second aspect of the disclosure includes a memory, comprising: a three dimensional, dynamic random access memory (3D DRAM) stack; a thermoelectric heat pump coupled directly to an uppermost layer of the 3D DRAM stack; a memory controller operatively coupled to the 3D DRAM stack to control operation of the 3D DRAM stack; and a temperature controller operatively coupled to one of the processor and the 3D DRAM stack for controlling a temperature of the 3D DRAM stack using the thermoelectric heat pump.

A third aspect of the disclosure related to a method, comprising: forming a dynamic random access memory (DRAM) stack including a plurality of DRAM layers on a memory controller die; forming an uppermost DRAM layer of the DRAM stack, the uppermost DRAM layer including external heat pump electrical interconnections that extend through the DRAM stack to the memory controller; forming a thermoelectric heat pump on the uppermost DRAM layer;

and electrically connecting the thermoelectric heat pump to the external heat pump electrical interconnections in the uppermost DRAM layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a memory including a three dimensional, dynamic random access memory (3D DRAM) stack, and a thermoelectric heat pump coupled directly (integrally) to an uppermost layer of the 3D DRAM stack. Thermoelectric heat pump may also be referred to as a Peltier device. The thermoelectric heat pump includes an active, solid-state heat pump that can, with application of electrical energy, transfer heat from one side thereof to the other side depending on the direction of the current. That is, the thermoelectric heat pump can heat or cool the memory to which it is integrally formed. The memory may also include a memory controller operatively coupled to the 3D DRAM stack to control operation of the 3D DRAM stack. A temperature controller operatively coupled to one of the processor and the 3D DRAM stack controls a temperature of the 3D DRAM stack using the thermoelectric heat pump.

The memory including the integral thermoelectric heat pump allows for precise control of an IC chip package including the memory. The teachings of the disclosure are applicable to a 2.5D IC chip package, which include processor(s) integrated on an interposer substrate with the memory. Integrating a thermoelectric heat pump in the memory between the memory and the lid of the IC chip package allows active temperature control of the memory, allowing embodiments of the disclosure to address the operational temperature mismatch between the processor and the memory. For example, controlling a temperature of the memory to remain cooler than the lid of the IC chip package allows the processor to operate at a higher temperature than would otherwise be possible. The thermoelectric heat pump being integrally formed with the memory makes the IC chip package easier to build.

Figure 1:
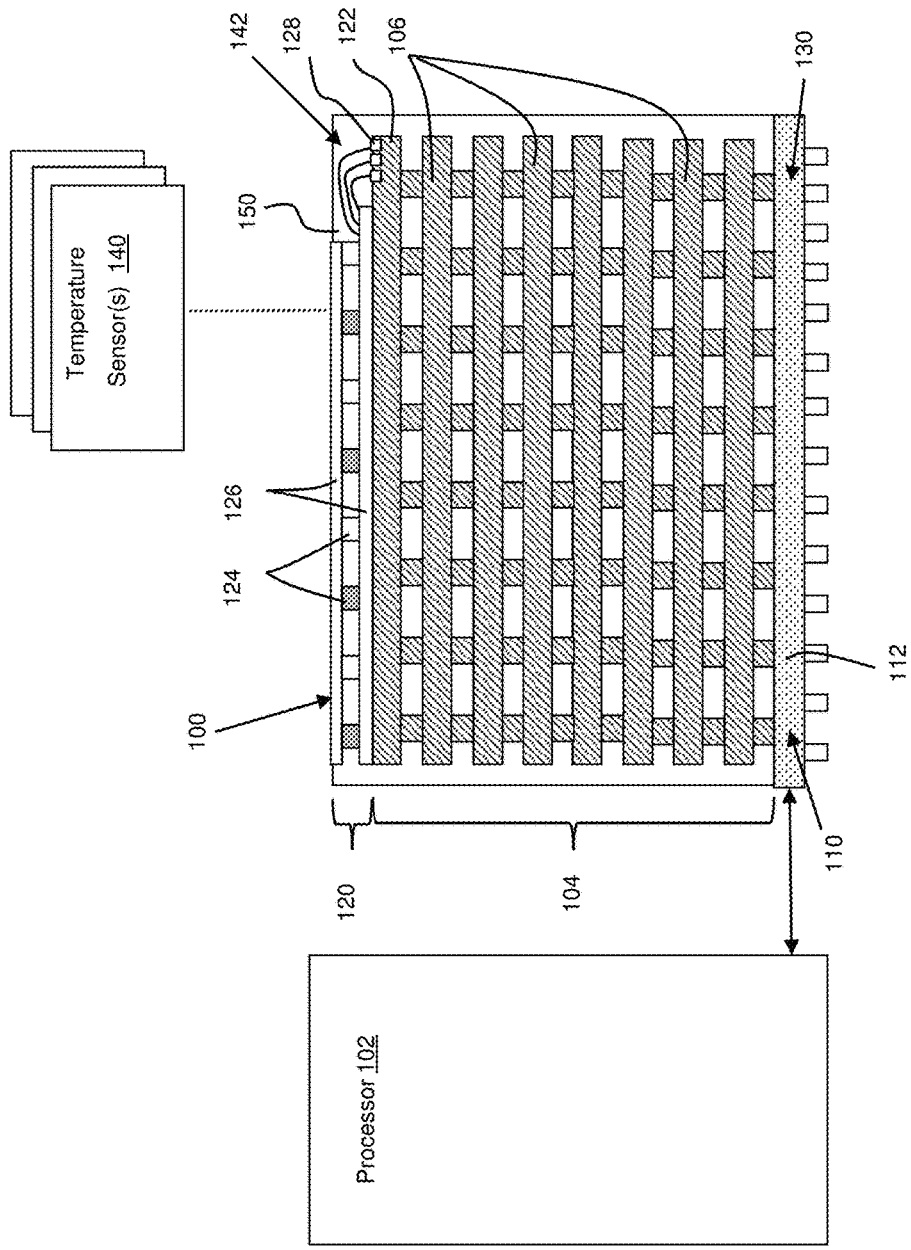
FIG. 1 shows a cross-sectional, schematic view of a memory and a processor according to embodiments of the disclosure.
Figure 2:
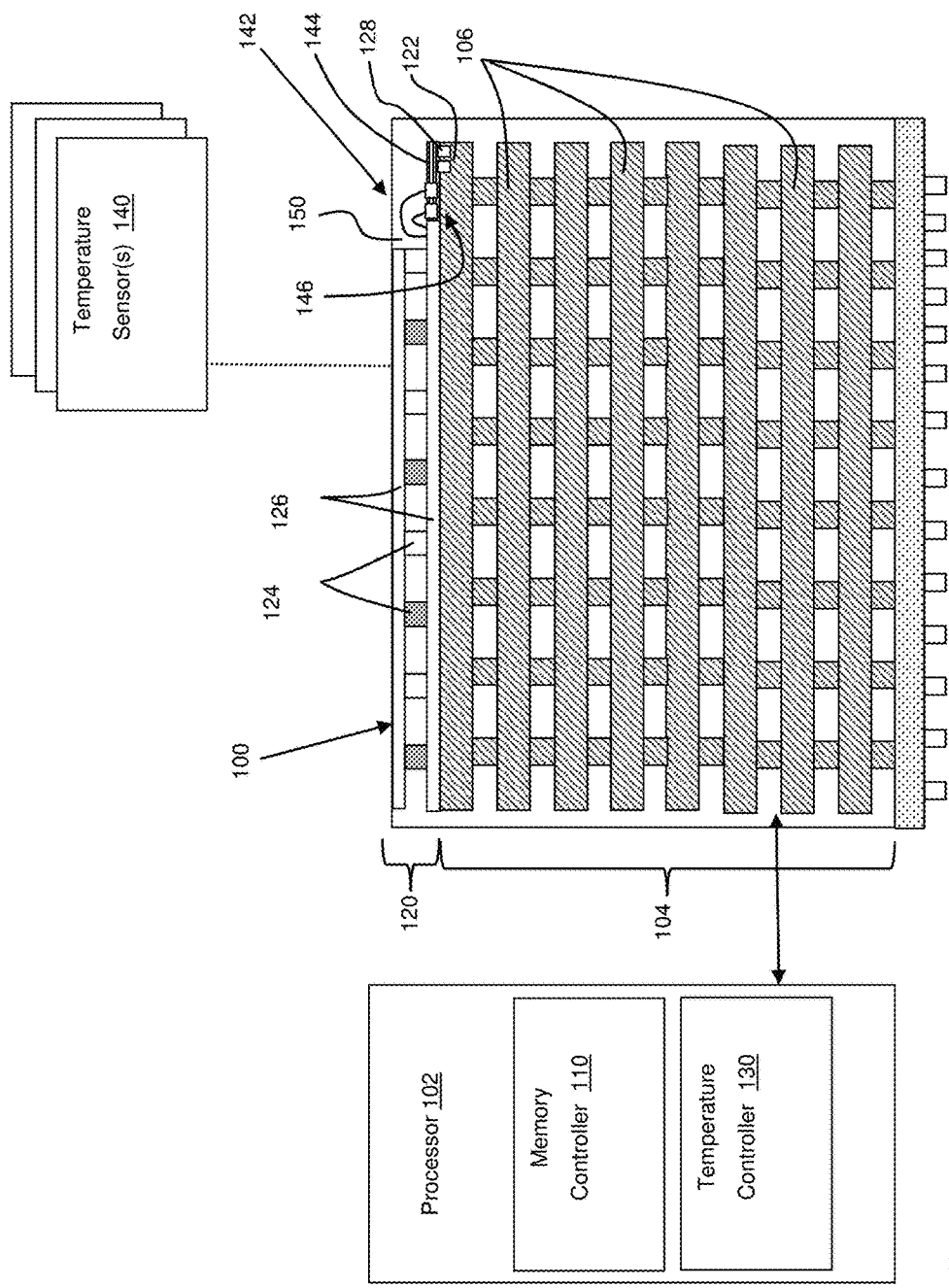
FIG. 2 shows a cross-sectional, schematic view of a memory and a processor according to alternative embodiments of the disclosure.

Referring to the drawings, FIGS. 1 and 2 show cross-sectional, schematic views of a memory 100 and a processor 102 according to embodiments of the disclosure. Processor 102 may include any now known or later developed processing component such as but not limited to: an application specific integrated circuit (ASIC) chip, a high performance graphics accelerator, a networking device, or a sound card processor. As shown in FIGS. 1 and 2, memory 100 may include a three dimensional, dynamic random access memory (3D DRAM) stack 104. In this regard, memory 100 may include what is commonly referenced as a high bandwidth memory (HBM), which is a high performance RAM interface for 3D-stacked DRAM that provides greater capacity, lower voltage and lower costs compared to conventional RAM. As understood in the field, 3D DRAM stack 104 includes a number of DRAM dies or layers 106 (not all labeled, 8 shown but could be any number) that are interconnected with through semiconductor vias (TSVs) or microbumps (shown). An 8 die 3D DRAM stack 104 may be referred to as an HBM2 ($2^{nd}$ generation). A memory controller 110 may also be operatively coupled to 3D DRAM stack 104 to control operation of the 3D DRAM stack. In one example, shown in FIG. 1, memory controller 110 may be provided as at least part of a base die 112 of DRAM stack 104, i.e., as part of memory 100. However, memory controller 110 may also be provided in a number of alternative locations, e.g., within processor 102 (FIG. 2), as a separate die, etc. Memory controller 110 may include any software, hardware and/or firmware configured to operate memory 100. Memory controller 110 may be electrically coupled to processor 102 through an interposer substrate 220 (FIG. 3), described elsewhere herein.

In contrast to conventional memories, memory 100 also includes a thermoelectric heat pump 120 coupled directly to an uppermost layer 122 of 3D DRAM stack 104. Thermoelectric heat pump 120 is integrally formed with uppermost layer 122 rather than simply thermally coupled using a heat spreader or other thermally conductive structure. Thermoelectric heat pump 120 may include sections 124 of semiconductor materials including different dopants (n-doped and p-doped) sandwiched between two conductive layers 126. One of the conductive layers 126 is in direct thermal communication with uppermost layer 122 of 3D DRAM stack 104.

A temperature controller 130 may be operatively coupled to one of processor 102 (FIG. 2) and 3D DRAM stack 104 (FIG. 1) for controlling a temperature of the 3D DRAM stack 104 using thermoelectric heat pump 120. In one example, shown in FIG. 1, temperature controller 130 may be provided as at least part of base die 112 of DRAM stack 104, i.e., as part of memory 100. However, memory controller 110 may also be provided in a number of alternative locations, e.g., within processor 102 (FIG. 2), as a separate die, etc. Memory 100 may further include one or more temperature sensor(s) 140 operatively coupled to temperature controller 130. Each temperature sensor(s) 140 can include any now known or later developed sensor system capable of measuring a temperature of a particular location within memory 100. Each temperature measurement can be received by temperature controller 130, e.g., via electrical interconnections in 3D DRAM stack 104, via wiring to processor 102, via wiring in interposer substrate 220 (FIG. 3), etc. The location at which the temperature(s) is/are measured can be user defined, e.g., any position at which the 3D DRAM stack 104 operation is sensitive to temperature variation. Temperature controller 130 controls the temperature of 3D DRAM stack 104 based on a measured temperature(s) from the temperature sensor(s) 140. Temperature controller 130 may include any software, hardware and/or firmware configured to operate thermoelectric heat pump 120. Temperature controller 130 and temperature sensors 140 may be electrically coupled to each other, processor 102, memory controller 110 and/or thermoelectric heat pump 120 through DRAM stack 104, interposer substrate 220 (FIG. 3) or any other chip package wiring necessary. Operation of temperature controller 130 will be described elsewhere herein.

Thermoelectric heat pump 120 may be integrated with memory 100 in a number of ways. In one embodiment, shown in FIG. 1, uppermost layer 122 of 3D DRAM stack 104 includes heat pump electrical connections 128 for controlling operation of thermoelectric heat pump 120 on an upper surface thereof. Heat pump electrical connections 128 may be positioned to allow thermoelectric heat pump 120 to be wire bonded directly thereto, i.e., via wire bonds 142. Any number of wire bonds 142 may be used depending on how thermoelectric heat pump 120 is arranged, e.g., as a single element, in sections, etc. In another embodiment shown in FIG. 2, uppermost layer 122 of 3D DRAM stack 104 may include heat pump electrical connections 128 for controlling operation of thermoelectric heat pump 120 on an upper surface thereof, similar to FIG. 1. However, in the FIG. 2 embodiment, a redistribution layer (RDL) 144 may be provided on at least a portion of the upper surface of uppermost layer 122. RDL 144 may include any extra metal layer making input/output pads available in other locations, e.g., heat pump electrical interconnections 128. RDL 144 thus may include redirected heat pump electrical interconnections 146 electrically connected to heat pump interconnections 128 of uppermost layer 122 of 3D DRAM stack 104. Thermoelectric heat pump 120 may be wire bonded via wire bonds 142 to redirected heat pump electrical connections 146 of RDL 144. Any repositioning of electrical interconnections may be had with RDL 144. Thermoelectric heat pump 120 and wire bonds 142 may be encapsulated using any now known or later developed encapsulant 150.

Figure 3:
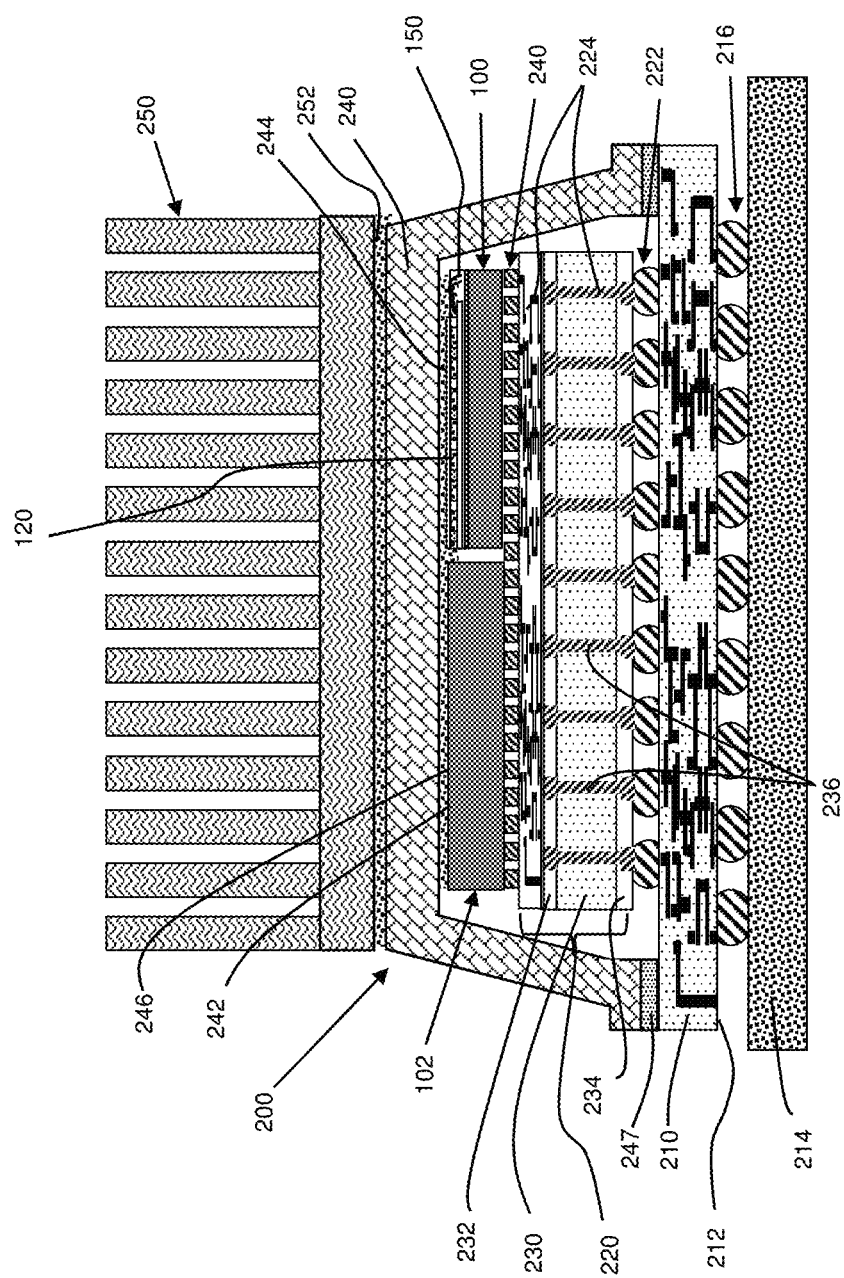
FIG. 3 shows a cross-sectional view of an IC chip package including the memory and processor of FIG. 1 or FIG. 2.

FIG. 3 shows a cross-sectional view of an IC chip package 200 according to embodiments of the disclosure. IC chip package 200 includes memory 100 and processor 102 of FIG. 1 or FIG. 2. While IC chip package 200 is shown including a single processor 102 and single memory 100, it is emphasized that each may be duplicated within the IC chip package, i.e., any number of processors or memories may be employed. In this example, IC chip package 200 is shown in the form of a 2.5D IC chip package. To this end, IC chip package 200 includes a base substrate 210. Base substrate 210 may include, for example, any now known or later developed circuit board for scaling wiring within IC chip package 200. Base substrate 210 may be coupled on an outer surface 212 thereof to a circuit board (PCB) 214 by package bumps 216. IC chip package 200 also includes interposer substrate 220 including a plurality of wires 224 therein, per 2.5D IC chip packaging protocols. Interposer substrate 220 operatively couples to base substrate 210, e.g., via interposer bumps 222. Each processor 102 and memory 100 is also operatively positioned on interposer substrate 220. Interposer substrate 220 may include any now known or later developed element for electrically interconnecting processor 102 and memory 100 within IC chip package 200 per conventional 2.5D chip package protocols. In one embodiment, interposer substrate 220 includes a semiconductor layer 230 having frontside metal interconnect layers 232 on a first side thereof, backside metal interconnect layers 234 on a second side thereof and a plurality of through semiconductor vias (TSVs) 236 electrically connecting frontside metal interconnect layers 232 and backside metal interconnect layers 234. Frontside metal interconnect layers 232 operatively couple to memory 100 and processor 102 using micro-bumps 240 and backside metal interconnect layers 234 operatively couple to the base substrate 210 using package bumps 222. Any variety of metal wires may be provided in frontside or backside metal interconnect layers 232, 234 for routing of electrical signals.

Memory 100 is operatively positioned on interposer substrate 220 and is operatively coupled to processor 102 through interposer substrate 220. As described herein, memory 100 includes 3D DRAM stack 104 (FIGS. 1-2), thermoelectric heat pump 120 coupled directly to uppermost layer 122 (FIGS. 1-2) of 3D DRAM stack 104 (FIGS. 1-2), and memory controller 110 (FIGS. 1-2) operatively coupled to 3D DRAM stack 104 (FIGS. 1-2) to control operation of the 3D DRAM stack. Memory controller 110 may be part of memory 100 (FIG. 1), part of processor 102 (FIG. 2) or located elsewhere within the package, e.g., as a separate die. IC chip package 100 may also include temperature controller 130 operatively coupled to thermoelectric heat pump 120 for controlling a temperature of 3D DRAM stack 104 (FIGS. 1-2) using the thermoelectric heat pump. Temperature controller 130 may be part of memory 100 (FIG. 1), part of processor 102 (FIG. 2), located elsewhere within the package, e.g., as a separate die, or in a separate IC joined to same PCB 214.

IC chip package 200 also includes a lid 240 thermally coupled to an uppermost surface 242 of processor 102 and an uppermost surface 244 of thermoelectric heat pump 120. Lid 240 may include any now known or later developed IC chip package lid, e.g., of aluminum or other thermally conductive material. Lid 240 may be physically and thermally coupled to base substrate 210, e.g., via a thermal adhesive 247.

Thermoelectric heat pump 120 may be connected to 3D DRAM stack 104, as described herein. Temperature sensor(s) 140 may be employed as described herein. In accordance with embodiments of the disclosure, thermoelectric heat pump 120 has a height configured to have uppermost surface 244 (FIGS. 1-2) of memory 100 at substantially the same height as uppermost surface 242 (FIG. 3) of processor 102. In this fashion, lid 240 meets evenly with processor 102 and thermoelectric heat pump 120. Where desired, a thermal interface material (TIM) 246 may be used between lid 240 and at least one of uppermost surface 244 of thermoelectric heat pump 120 and uppermost surface 242 of processor 102. TIM 246 may include any now known or later developed material to enhance thermal coupling between two components, e.g., thermal grease, thermal glue, thermal gap filler, thermal pad, thermal adhesive, etc.

Optionally, a heat sink 250 may be coupled to lid 240. Where desired, a TIM 252 may be used between lid 240 and heat sink 252. TIM 252 may be any of the materials listed previously for TIM 246.

A method according to embodiments of the disclosure may include forming DRAM stack 104 including a plurality of DRAM layers 106 on a memory controller die 110 (FIG. 1). DRAM stack 104 and memory controller 110 may be made using any now known or later developed semiconductor fabrication processes. The method may further include forming uppermost DRAM layer 122 of DRAM stack 104 including external heat pump electrical interconnections 128 (FIGS. 1-2) that extend through DRAM stack 104 to memory controller 110. Uppermost DRAM layer 122 may be made using any now known or later developed semiconductor fabrication processes. As described herein, the method may also include forming thermoelectric heat pump 120 on uppermost DRAM layer 122 (FIGS. 1-2). Thermoelectric heat pump 120 may be formed in parts on DRAM stack 104, e.g., by placing lower conductive layer 126 (FIGS. 1-2) thereon, forming sections 124 (FIGS. 1-2) of semiconductor materials including different dopants (n-doped and p-doped), and then forming an upper conductive layer 126 (FIGS. 1-2). Alternatively, thermoelectric heat pump 120 may be manufactured separately and mounted to uppermost layer 122 (FIGS. 1-2) of DRAM stack 104 (FIGS. 1-2).

The method may also include electrically connecting thermoelectric heat pump 120 to external heat pump electrical interconnections 128 (FIGS. 1-2) in uppermost DRAM layer 122. This process may include forming RDL 144 on at least a portion of the upper surface of uppermost DRAM layer 122 (FIGS. 1-2) prior to forming the thermoelectric heat pump 120. RDL 144 may include redirected heat pump electrical interconnections 146 configured to electrically connect at a first end thereof to external heat pump electrical connections 128 of uppermost DRAM layer 122. This process may further include wire bonding thermoelectric heat pump 120 to redirected heat pump electrical connections 146 (FIGS. 1-2) of RDL 144 at a second end thereof. In this setting, thermoelectric heat pump 120 may have an areal dimension that is less than an areal dimension of uppermost layer 122 of DRAM stack 104. That is, thermoelectric heat pump 120 does not cover all of uppermost layer 122, allowing for electrical interconnections to be made in this space. Thermoelectric heat pump 120 and wire bonds 142 may be encapsulated using any now known or later developed encapsulant 150.

The method may further include packaging memory 100 in IC chip package 200 with processor 102. This process may include operatively mounting processor 102 and memory 100 to interposer substrate 220, the interposer substrate electrically interconnecting the processor and the memory. As noted, thermoelectric heat pump 120 and processor 102 may have uppermost surfaces 242, 244 (FIG. 3) that are coplanar, such that placing lid 240 thereover, places it in thermal communication with the coplanar uppermost surfaces 242, 244 of processor 102 and thermoelectric heat pump 120.

In operation, temperature controller 130 may control thermoelectric heat pump 120 to control a temperature of 3D DRAM stack 104. For example, temperature controller 130 may heat 3D DRAM stack 104 in response to a temperature thereof being below a low operational temperature threshold of 3D DRAM stack 104. For example, where the temperature below which memory 100 will not operate properly is 0° C., and the actual temperature is below that temperature, temperature controller 130 may direct an electrical signal into thermoelectric heat pump 120 in such a way to cause a heating of 3D DRAM stack 104. In another example, temperature controller 130 may cool 3D DRAM stack 104 in response to the temperature being above a high operational temperature threshold of the 3D DRAM stack. For example, where memory 100 will not operate properly above 85° C., and the temperature is above that temperature, temperature controller 130 may direct an electrical signal into thermoelectric heat pump 120 in such a way to cause a cooling of 3D DRAM stack 104. The temperature can be measured at any one or more locations using temperature sensors 140 (not shown in FIG. 3, embedded). Where multiple temperature sensors 140 are employed, the measured temperatures can be combined in any now known or later developed fashion, e.g., averaged, etc.

Integrating a thermoelectric heat pump 120 in 3D DRAM stack 104, e.g., of an HBM, between DRAM stack 104 and lid 240 allows active temperature control of 3D DRAM stack 104, allowing it to remain cooler than the lid and allowing processor 102 to operate at a higher temperature than would otherwise be possible. Processor 102 can thus operate at more efficient temperatures while keeping memory 100 within its ideal operating temperature range. Further, temperature control of memory 100 allows for operation thereof in more extreme temperature environments, e.g., automotive or aerospace applications, than previously permitted. Teachings of the disclosure are applicable with any 2.5D chip package application with memory 100 such as an HBM, such as networking, general processing unit (GPU) or central processing unit (CPU) applications.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) chip package, comprising:
   a base substrate;
   an interposer substrate including a plurality of wires therein, the interposer substrate operatively coupled to the base substrate;
   a processor operatively positioned on the interposer substrate;

a memory operatively positioned on the interposer substrate and operatively coupled to the processor through the interposer substrate, the memory including:
a three dimensional, dynamic random access memory (3D DRAM) stack, and
a thermoelectric heat pump coupled directly to an uppermost layer of the 3D DRAM stack;
a memory controller operatively coupled to the 3D DRAM stack to control operation of the 3D DRAM stack;
a temperature controller operatively coupled to the thermoelectric heat pump for controlling a temperature of the 3D DRAM stack using the thermoelectric heat pump; and
a lid thermally coupled to an uppermost surface of the processor and an uppermost surface of the thermoelectric heat pump.

2. The IC chip package of claim 1, wherein the uppermost layer of the 3D DRAM stack includes heat pump electrical connections for controlling operation of the thermoelectric heat pump on an upper surface thereof, and wherein the thermoelectric heat pump is wire bonded to the heat pump electrical connections.

3. The IC chip package of claim 1, wherein the uppermost layer of the 3D DRAM stack includes heat pump electrical connections for controlling operation of the thermoelectric heat pump on an upper surface thereof, and further comprising:
a redistribution layer (RDL) on at least a portion of the upper surface, the RDL including redirected heat pump electrical interconnections electrically connected to the heat pump interconnections of the uppermost layer of the 3D DRAM stack,
wherein the thermoelectric heat pump is wire bonded to the redirected heat pump electrical connections of the RDL.

4. The IC chip package of claim 1, wherein the memory further includes a temperature sensor operatively coupled to the temperature controller, the temperature controller controlling the temperature of the 3D DRAM stack based on a measured temperature from the temperature sensor.

5. The IC chip package of claim 1, wherein the thermoelectric heat pump heats the 3D DRAM stack in response to a temperature thereof being below a low operational temperature threshold of the 3D DRAM stack, and cools the 3D DRAM stack in response to the temperature being above a high operational temperature threshold of the 3D DRAM stack.

6. The IC chip package of claim 1, further comprising a thermal interface material (TIM) between the lid and at least one of the uppermost surface of the thermoelectric heat pump and the uppermost surface of the processor.

7. The IC chip package of claim 1, further comprising a circuit board operatively coupled to the base substrate.

8. The IC chip package of claim 1, wherein the thermoelectric heat pump has a height configured to have an uppermost surface of the memory at substantially the same height as an uppermost surface of the processor.

9. The IC package of claim 1, wherein the interposer substrate includes:
a semiconductor layer having frontside metal interconnect layers on a first side thereof, backside metal interconnect layers on a second side thereof and a plurality of through semiconductor vias (TSVs) electrically connecting the frontside metal interconnect layers and the backside metal interconnect layers, and
wherein the frontside metal interconnect layers operatively couple to the memory and the processor using micro-bumps and the backside metal interconnect layers operatively couple to the base substrate using package bumps.

10. A memory, comprising:
a three dimensional, dynamic random access memory (3D DRAM) stack;
a thermoelectric heat pump coupled directly to an uppermost layer of the 3D DRAM stack;
a memory controller operatively coupled to the 3D DRAM stack to control operation of the 3D DRAM stack; and
a temperature controller operatively coupled to the 3D DRAM stack for controlling a temperature of the 3D DRAM stack using the thermoelectric heat pump.

11. The memory of claim 10, wherein the uppermost layer of the 3D DRAM stack includes heat pump electrical connections for controlling operation of the thermoelectric heat pump on an upper surface thereof, and wherein the thermoelectric heat pump is wire bonded to the heat pump electrical connections.

12. The memory of claim 10, wherein the uppermost layer of the 3D DRAM stack includes heat pump electrical connections for controlling operation of the thermoelectric heat pump on an upper surface thereof, and further comprising:
a redistribution layer (RDL) on at least a portion of the upper surface, the RDL including redirected heat pump electrical interconnections electrically connected to the heat pump interconnections of the uppermost layer of the 3D DRAM stack,
wherein the thermoelectric heat pump is wire bonded to the redirected heat pump electrical connections of the RDL.

13. The memory of claim 10, wherein the memory further includes a temperature sensor operatively coupled to the temperature controller, the temperature controller controlling the temperature of the 3D DRAM stack based on a measured temperature from the temperature sensor.

14. The memory of claim 10, wherein the temperature controller controls the thermoelectric heat pump to heat the 3D DRAM stack in response to a temperature thereof being below a low operational temperature threshold of the 3D DRAM stack, and cool the 3D DRAM stack in response to the temperature being above a high operational temperature threshold of the 3D DRAM stack.

* * * * *